(12) United States Patent
de Vries

(10) Patent No.: US 10,148,232 B2
(45) Date of Patent: Dec. 4, 2018

(54) PRE-AMPLIFIER CIRCUIT INCLUDING MICROPHONE PRE-AMPLIFIER STAGE

(71) Applicant: Tymphany HK Limited, Hong Kong (CN)

(72) Inventor: Sebastiaan de Vries, Donggua Ling (CN)

(73) Assignee: Tymphany HK Limited, Hong Kong (CN)

( * ) Notice: Subject to any disclaimer, the term of this patent is extended or adjusted under 35 U.S.C. 154(b) by 0 days.

(21) Appl. No.: 15/606,128

(22) Filed: May 26, 2017

(65) Prior Publication Data

US 2017/0346450 A1  Nov. 30, 2017

Related U.S. Application Data

(60) Provisional application No. 62/341,963, filed on May 26, 2016.

(51) Int. Cl.

| | |
|---|---|
| H03F 1/32 | (2006.01) |
| H03F 1/56 | (2006.01) |
| H03F 3/183 | (2006.01) |
| H03F 3/45 | (2006.01) |
| H04R 3/00 | (2006.01) |
| H03F 3/185 | (2006.01) |
| H03F 1/02 | (2006.01) |
| H03F 1/08 | (2006.01) |
| H03F 3/08 | (2006.01) |
| H03F 3/60 | (2006.01) |
| H04R 5/033 | (2006.01) |
| H04R 5/04 | (2006.01) |
| H03F 3/187 | (2006.01) |
| H03F 3/68 | (2006.01) |

(52) U.S. Cl.
CPC ............. *H03F 1/56* (2013.01); *H03F 1/0227* (2013.01); *H03F 1/083* (2013.01); *H03F 1/3205* (2013.01); *H03F 1/3211* (2013.01); *H03F 3/087* (2013.01); *H03F 3/183* (2013.01); *H03F 3/185* (2013.01); *H03F 3/187* (2013.01); *H03F 3/45475* (2013.01); *H03F 3/601* (2013.01); *H03F 3/68* (2013.01); *H04R 3/00* (2013.01); *H04R 3/005* (2013.01); *H04R 5/033* (2013.01); *H04R 5/04* (2013.01); *H03F 2200/03* (2013.01); *H03F 2200/387* (2013.01)

(58) Field of Classification Search
CPC ... H03F 1/56; H03F 3/68; H03F 3/187; H03F 1/3211; H03F 1/3205; H03F 5/04; H03F 1/083; H03F 1/0227; H03F 5/033; H03F 3/00; H03F 3/087; H03F 3/601; H03F 3/185; H03F 3/45475; H03F 3/183
USPC ......................... 381/111–113, 120, 122, 121
See application file for complete search history.

(56) References Cited

U.S. PATENT DOCUMENTS

| | | | |
|---|---|---|---|
| 2005/0089175 A1 | 4/2005 | Van Tassel | |
| 2011/0135118 A1* | 6/2011 | Osborne | ................... H04R 1/08 381/122 |
| 2014/0313608 A1* | 10/2014 | Nakabayashi | ...... H02M 3/1584 360/39 |

(Continued)

*Primary Examiner* — Disler Paul
(74) *Attorney, Agent, or Firm* — Cantor Colburn LLP

(57) ABSTRACT

A pre-amplifier circuit including a microphone pre-amplifier stage with a direct injection (DI) unit that provides a high impedance source signal and a low impedance XLR connection operable without a line or mic switch.

10 Claims, 12 Drawing Sheets

(56) References Cited

U.S. PATENT DOCUMENTS

2015/0365752 A1* 12/2015 McIntosh ................ H04R 1/08
381/122

* cited by examiner

PRE-AMPLIFIER CIRCUIT INCLUDING MICROPHONE PRE-AMPLIFIER STAGE

CROSS-REFERENCE TO RELATED APPLICATIONS

The present application claims priority to U.S. Provisional Application No. 62/341,963, filed on May 26, 2016, the contents of which are incorporated by reference herein in its entirety.

BACKGROUND

The present disclosure relates to audio applications, and more specifically, to audio amplifier circuits.

Conventional audio amplifiers typically require switchable microphone lines that provide low current DC output or are highly expensive. In addition, when utilizing a digital signal processor, an analog-to-digital converter (ADC) is implemented to convert the target analog signal into a digital signal to be processed by the DSP. The ADC, however, typically requires a bias voltage at its inputs. Therefore, an additional biasing ADC circuit is also implemented to provide the bias input voltage to the ADC.

SUMMARY

According to one embodiment, pre-amplifier circuit is provided including a microphone pre-amplifier stage. The microphone pre-amplifier stage including a direct injection (DI) unit that provides a high impedance source signal and a low impedance XLR connection operable without a line or mic switch. The pre-amplifier circuit further includes self-biasing input component (e.g., transistor pairs) that bias input to an analog-to-digital converter (ADC). In this manner, a low cost, high current DC coupled headphone output is provided.

According to a non-limiting embodiment, a microphone pre-amplifier circuit comprises a phantom power supply configured to generate input power, and a pair of input transistor circuits configured to generate a regulated input voltage based on the input power. A pair of differential microphone amplifier circuits is configured to amplify the regulated input voltage, and output the amplified voltage to an analog-to-digital converter (ADC). The microphone pre-amplifier circuit further comprises a direct current (DC) bias servo circuit in signal communication with the pair of differential microphone amplifier circuits and the ADC. The DC bias servo circuit is configured to control the pair of differential microphone amplifier circuits based on an internal common voltage (VCOM) of the ADC.

According to another non-limiting embodiment, a method of operating a microphone pre-amplifier circuit comprises generating an input power via a phantom power supply, and generating, via a pair of input transistor circuits, a regulated input voltage based on the input power. The method further includes amplifying the regulated input voltage, via a pair of differential microphone amplifier circuits, and outputting the amplified voltage to an analog-to-digital converter (ADC). The method further comprises controlling, via a direct current (DC) bias servo circuit, the pair of differential microphone amplifier circuits based on an internal common voltage (VCOM) of the ADC.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Typical microphone pre-amplifiers require amplification gains in the range from 40 to 70 dB to cope with condenser microphone small output voltages which can range of 3 Vrms to 40 Vrms. These high gains, however, can result in undesired amplified noise and system noise residue.

For example, the Johnson noise of a 200 ohm source resistance of a condenser microphone lies around 129 dBu. After applying 70 dB of gain, this 129 dBu becomes 59.6 dBu. To reduce the source-noise residue that can occur in professional audio applications, a "hybrid" approach was developed which has become a standard for many microphone pre-amplifier applications. The hybrid designs convert differential balanced inputs to single ended signals. In addition, the input transistor network implemented in the hybrid designs suffers from large total harmonic distortion (THD+N) and high transistor non-linearity. At least one embodiment of disclosure overcomes the deficiencies of the hybrid approach by providing a self-biasing differential MIC/Line Pre-Amplifier which biases an input transistor pair circuit pair included in the microphone pre-amplifier stage. In addition, the input transistor pair is incorporated inside a feedback loop defined by a pair of differential microphone amplifier circuits, which significantly reduces distortion and noise.

In addition, digital signal processors (DSPs) can be implemented audio systems to manipulate or perform digital signal processing on the source-signal. When a DSP is implemented, an analog-to-digital converter (ADC) is employed to convert an analog signal into a digital signal that is utilized by the DSP. ADCs may require that the input voltage be biased at around the internal common voltage (VCOM) (e.g., 2.5 VDC). To provide the biased input voltage, an ADC biasing circuit can be connected to the input(s) of the ADC.

Figure 3:
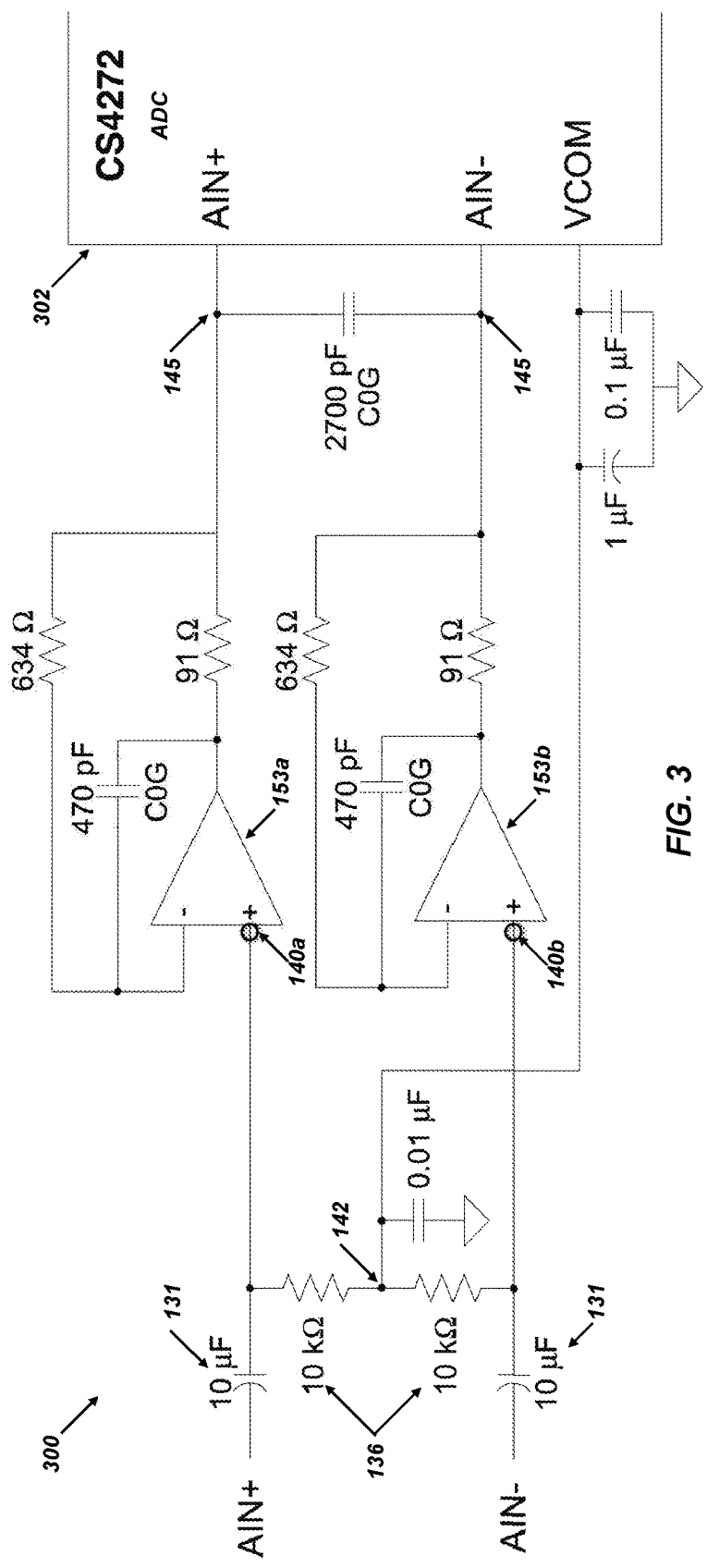
FIG. 3 is a schematic diagram of an ADC biasing circuit.

An example of an ADC biasing circuit 300 is illustrated in FIG. 3. The VCOM voltage 142 (e.g., 2.5 Vdc) is applied to resistor network 136 (e.g., series connected 10 kilo-ohm resistors), and delivered to non-inverting nodes 140a and 140b of the dual unity gain op-amp buffers 153a and 153b, respectively. In this manner, a 2.5 Vdc bias voltage appears on the outputs of the unity-gain op-amp buffers 153a and 153b, and appears at the input pins of the ADC 302 such that the audio signal is biased at approximately 2.5 Vdc. In addition, DC blocking capacitors 131a and 131b prevent the VCOM voltage to appear at the "AIN+" and "AIN−" pins, and the resistor network 136 (i.e., the 10 kilo-ohm resistors) sets the input impedance of the unity-gain op-amp buffers 153a and 153b.

Figure 1:
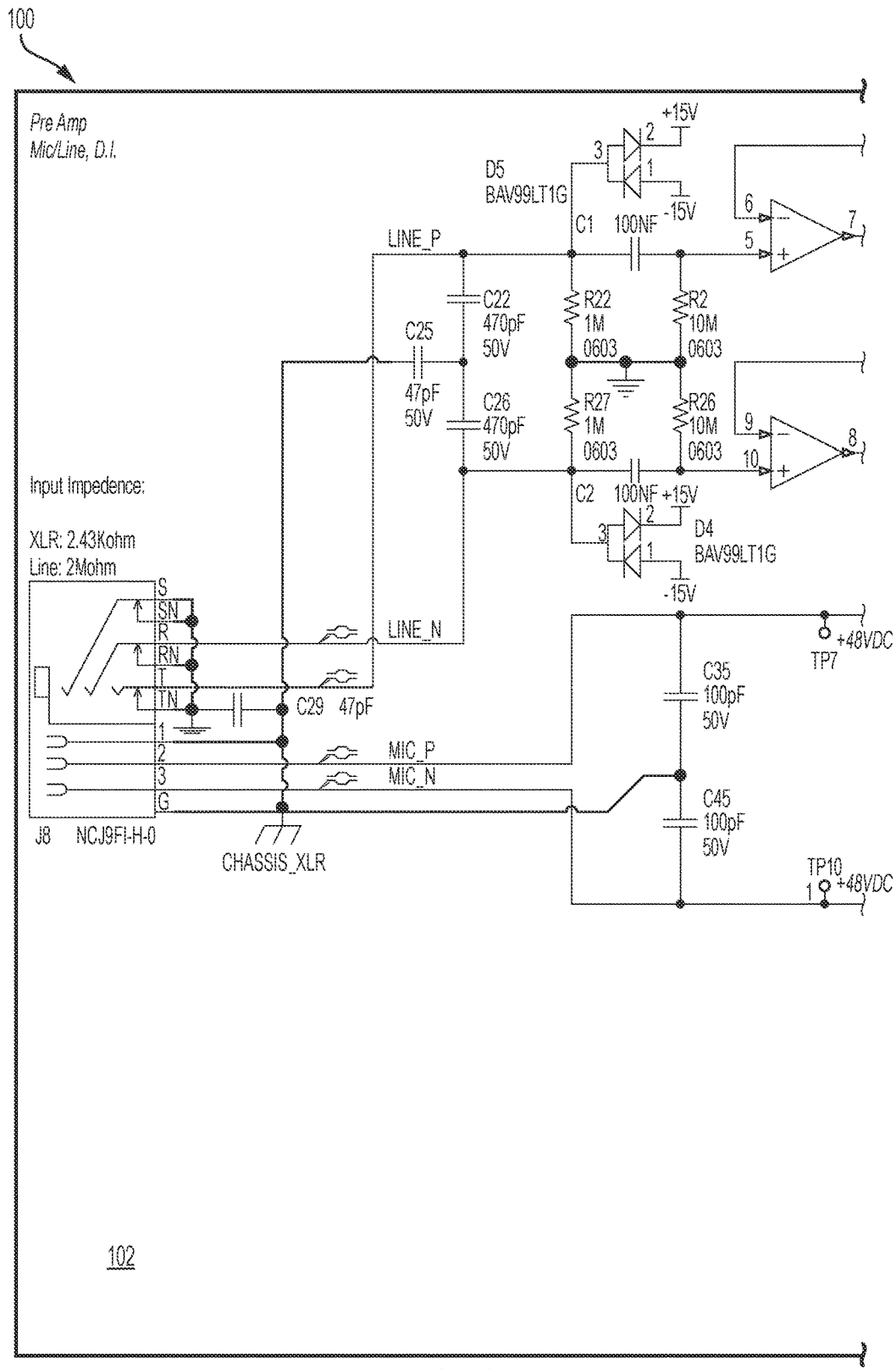
FIG. 1 is a schematic diagram of a pre-amplifier circuit including a microphone pre-amplifier stage having a high-impedance DI unit and low impedance XLR connector that can be operated without line/mic switch according to a non-limiting embodiment.
Figure 1:
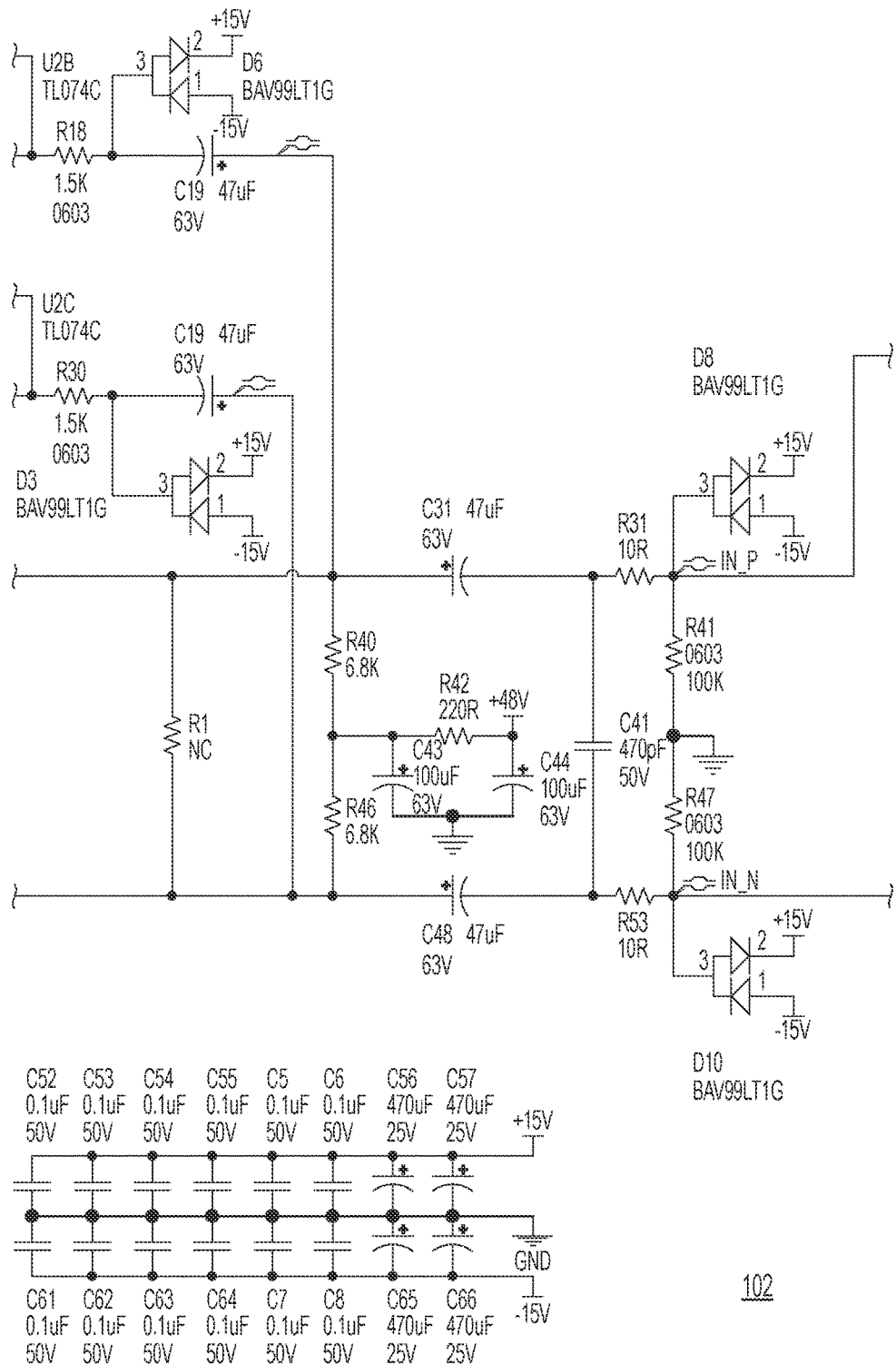
Figure 1:
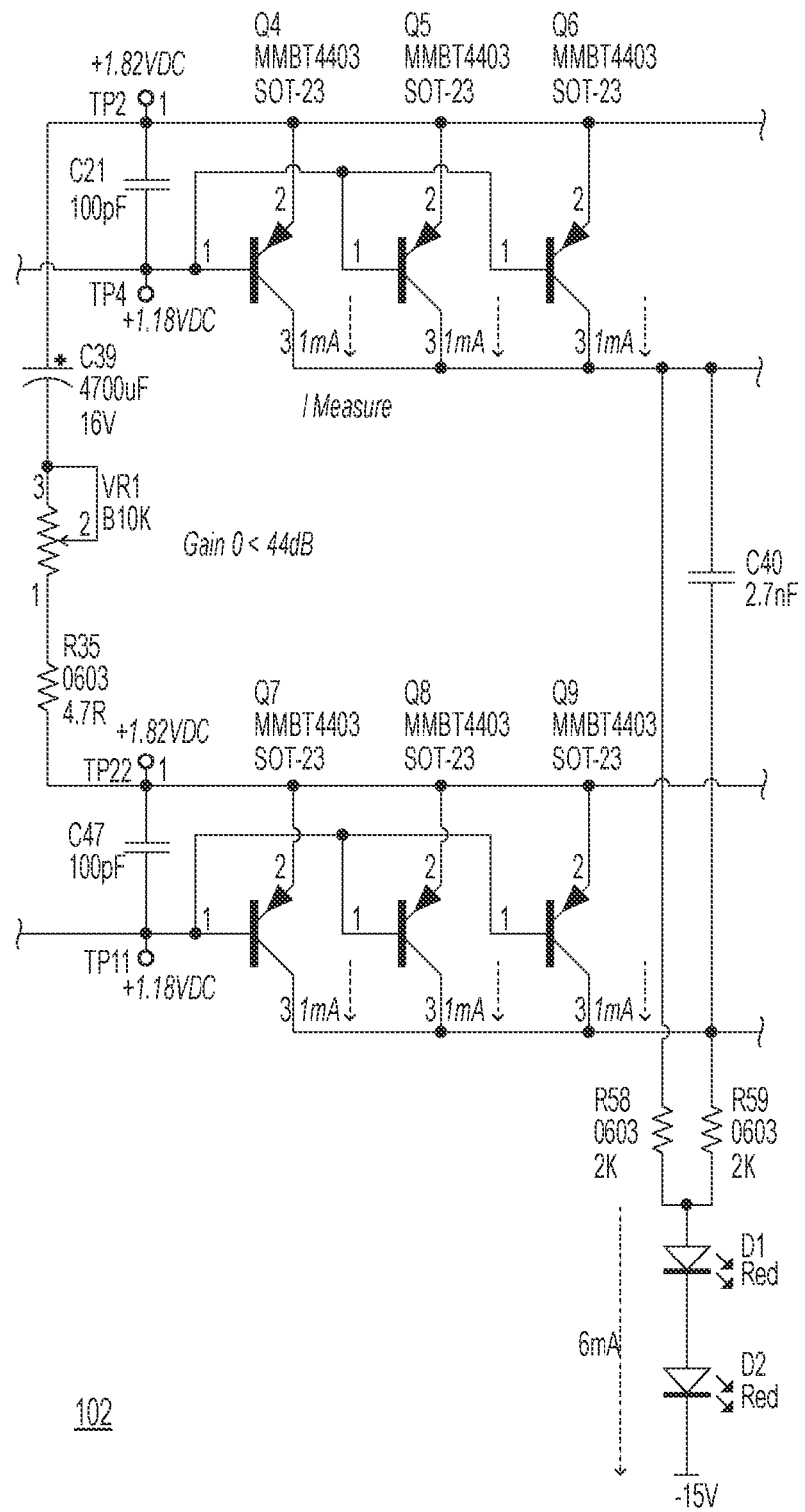
Figure 1:
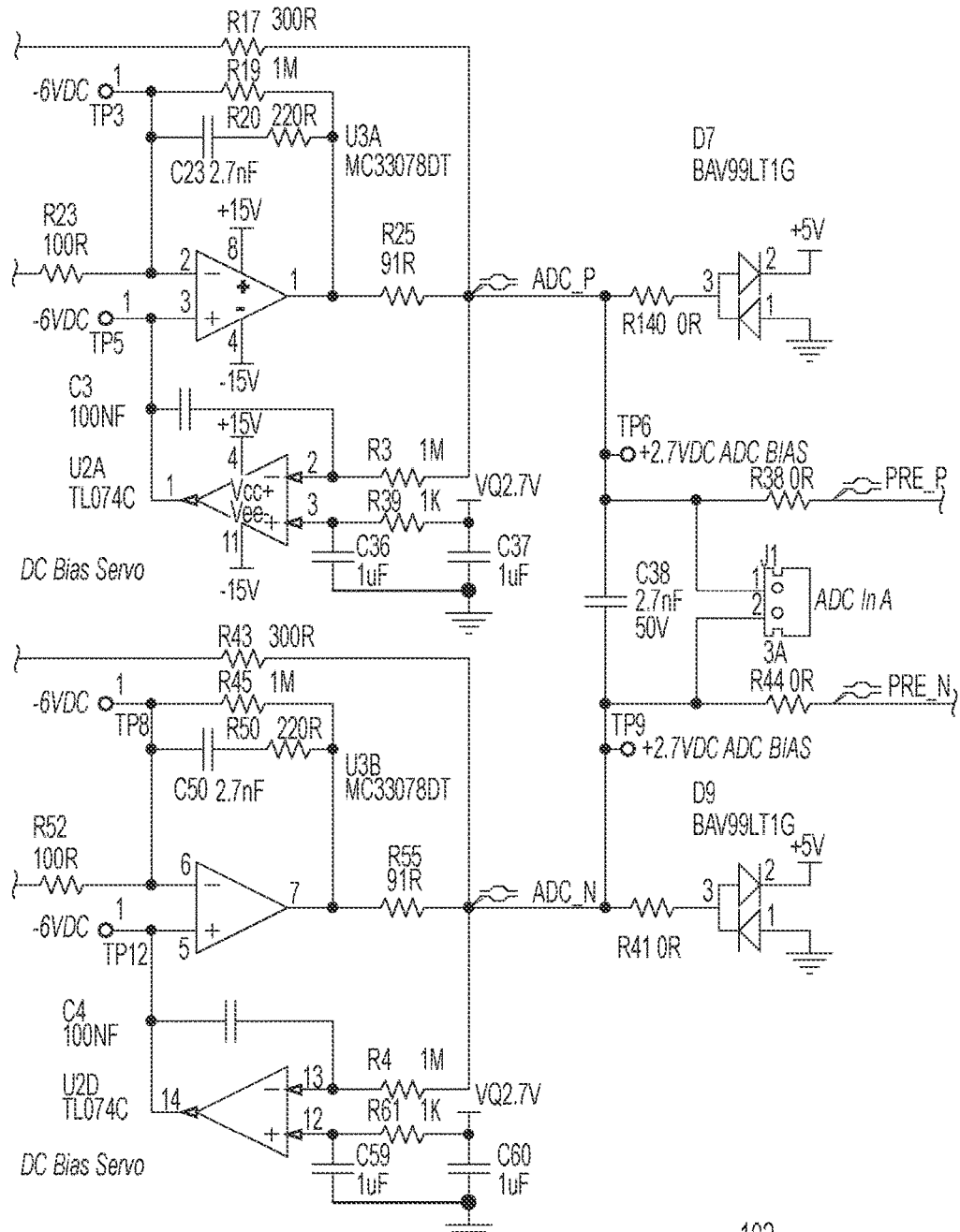
Figure 1:
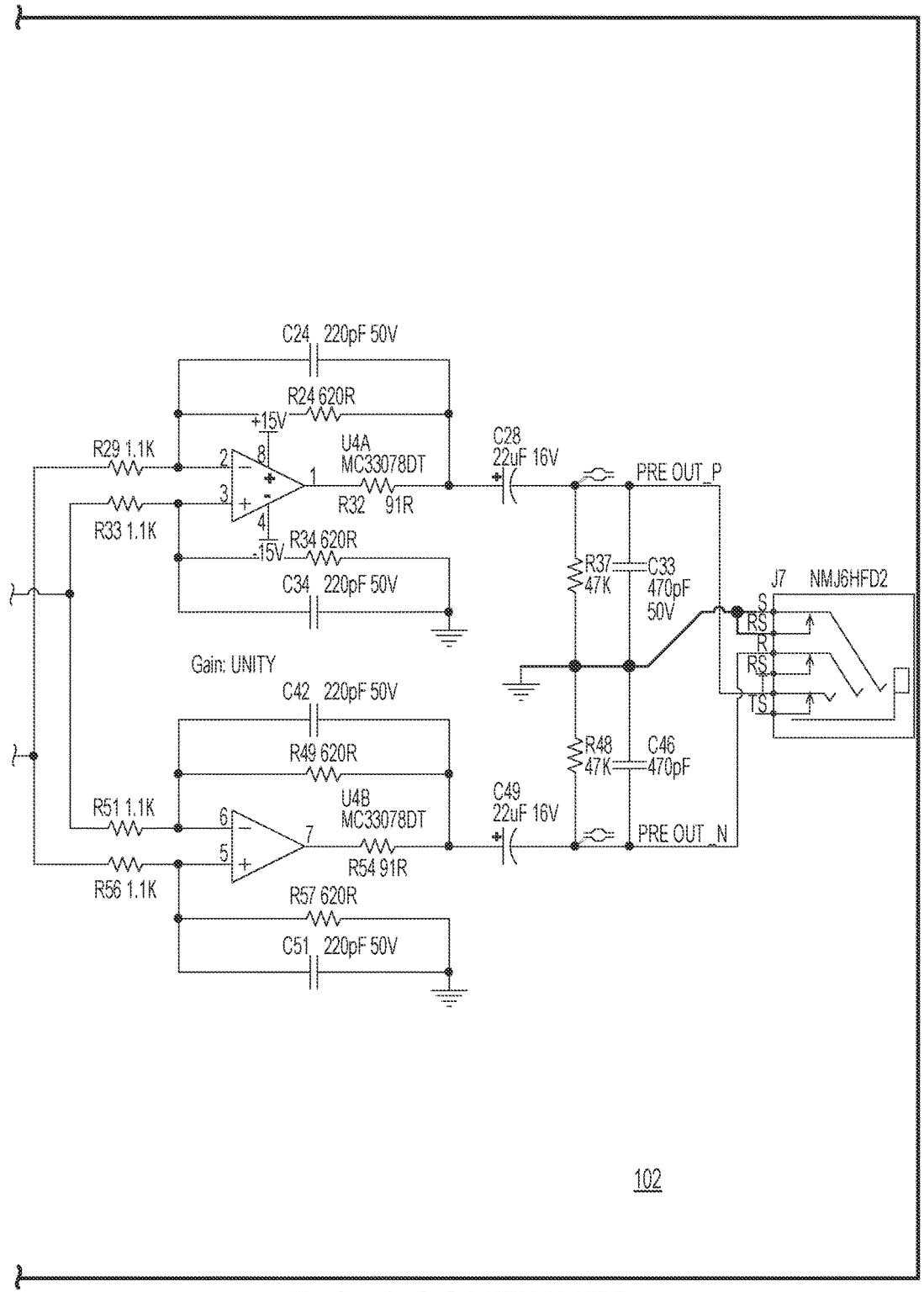
Figure 1:
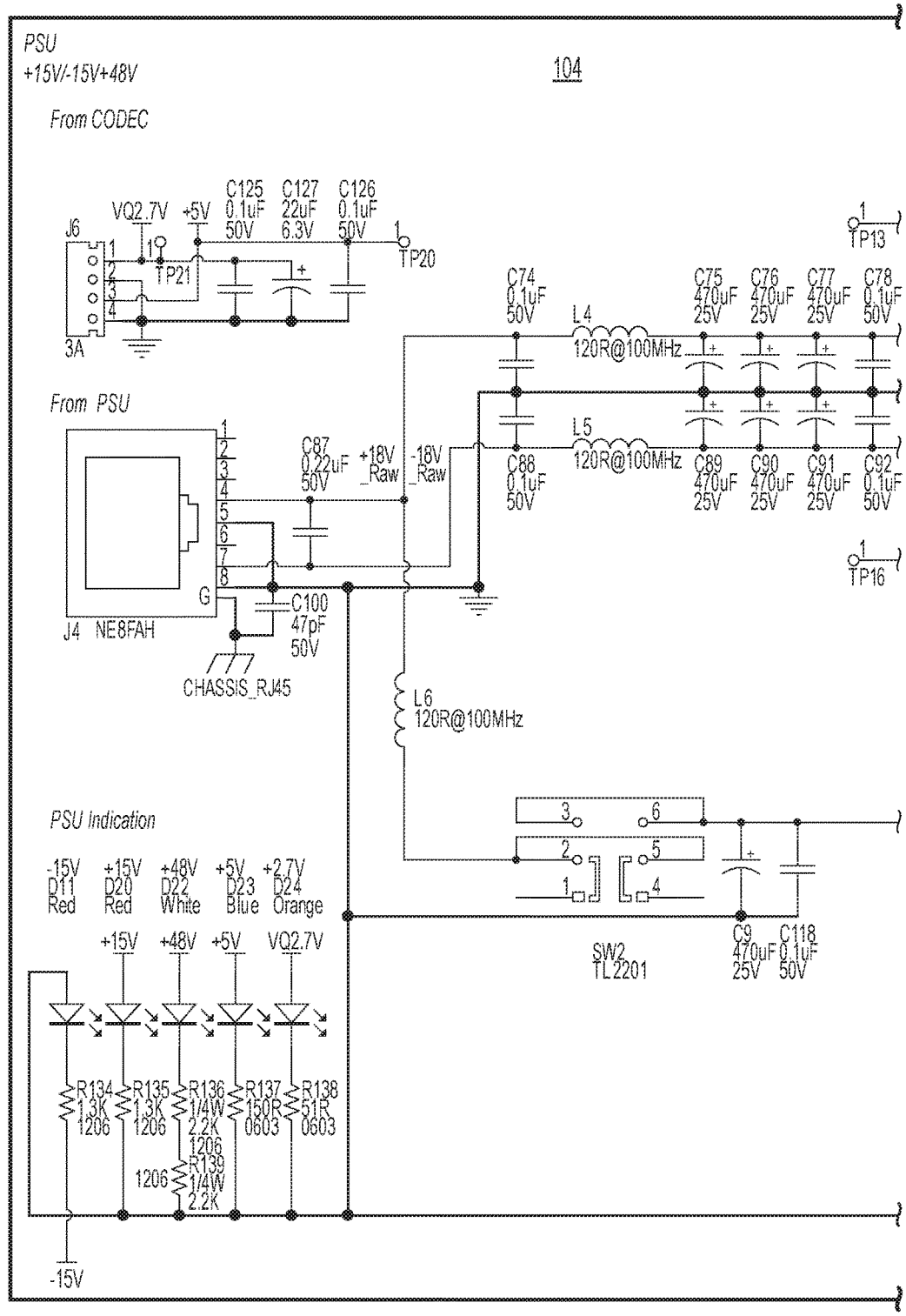
Figure 1:
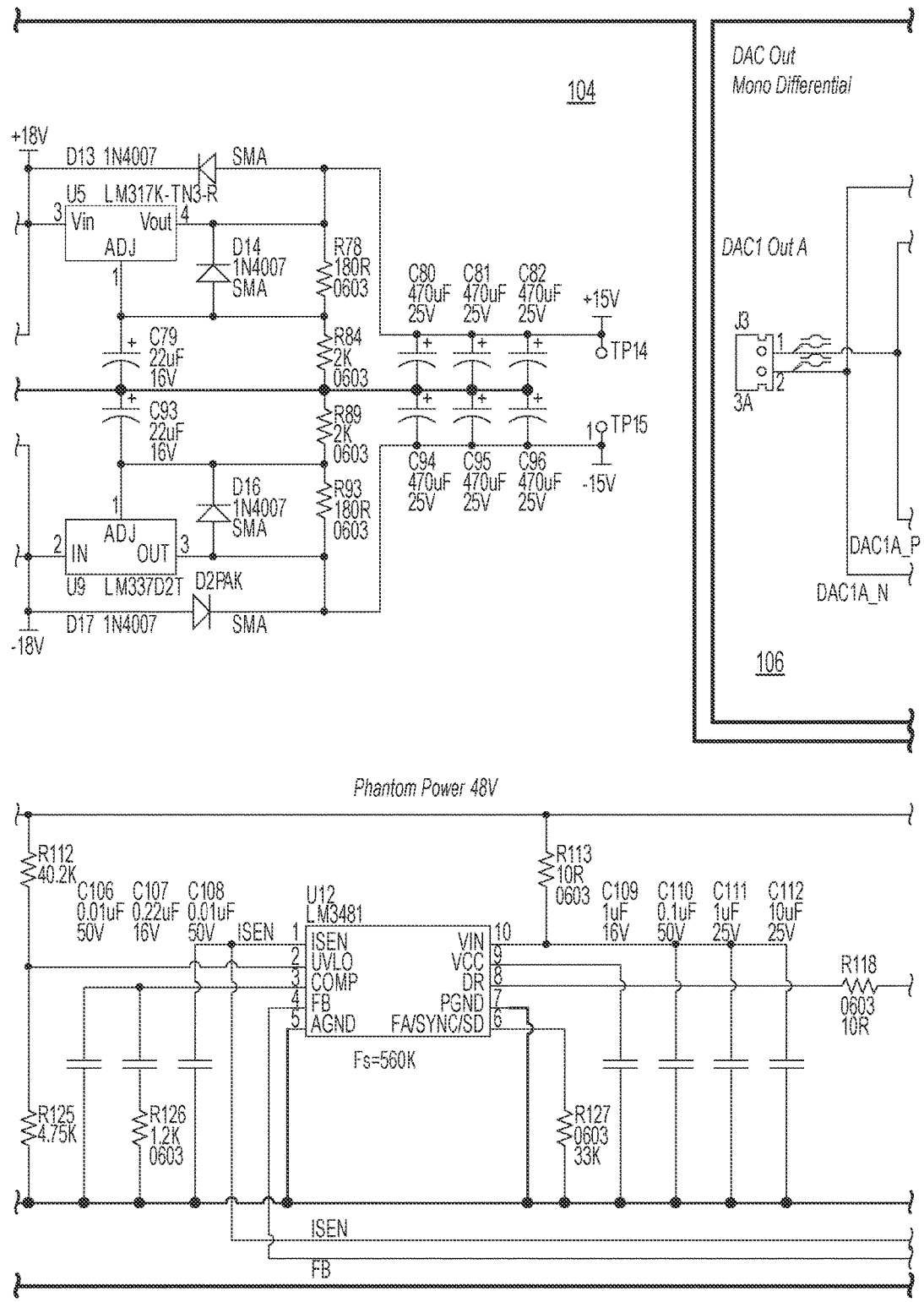
Figure 1:
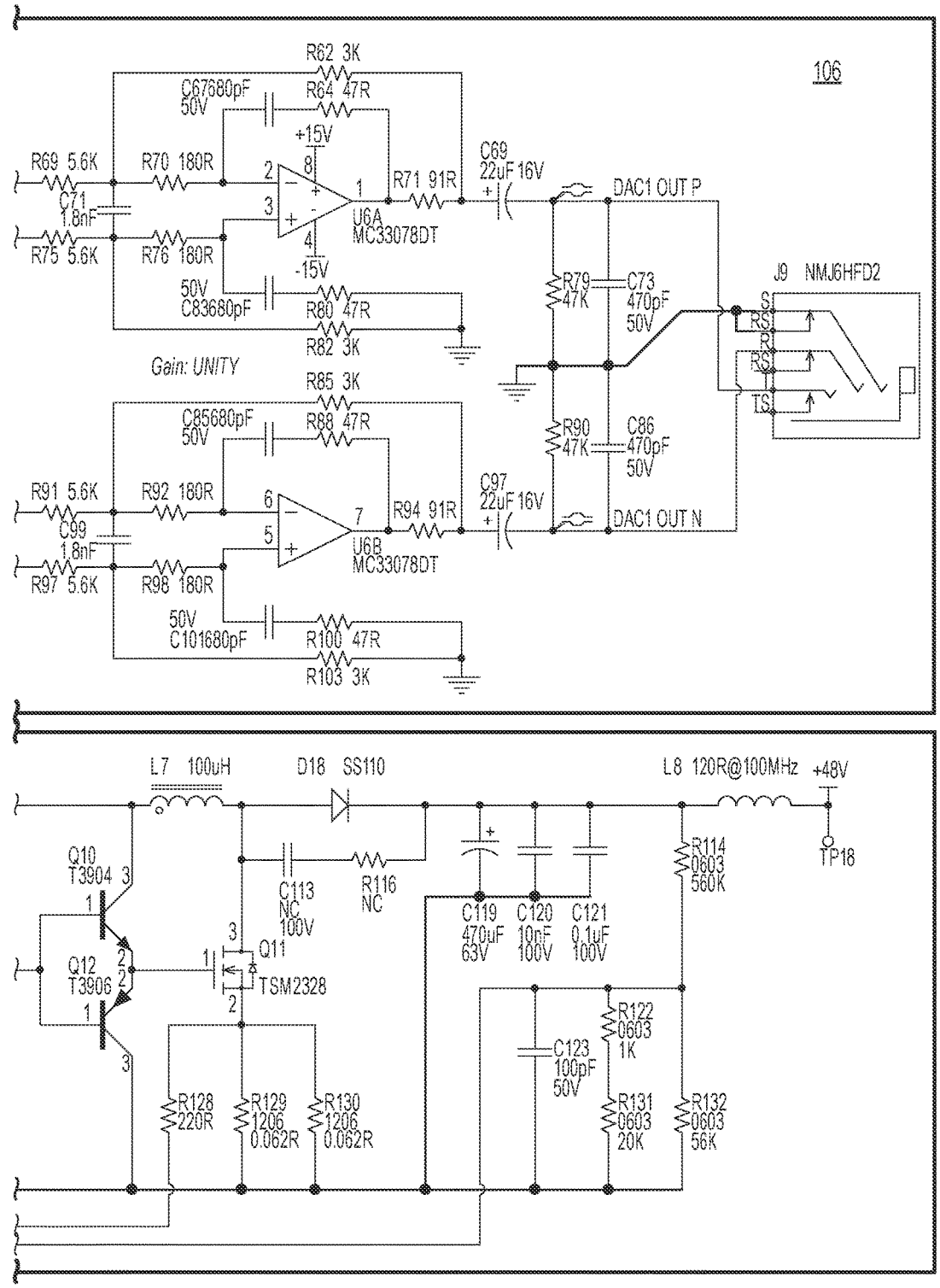
Figure 1:
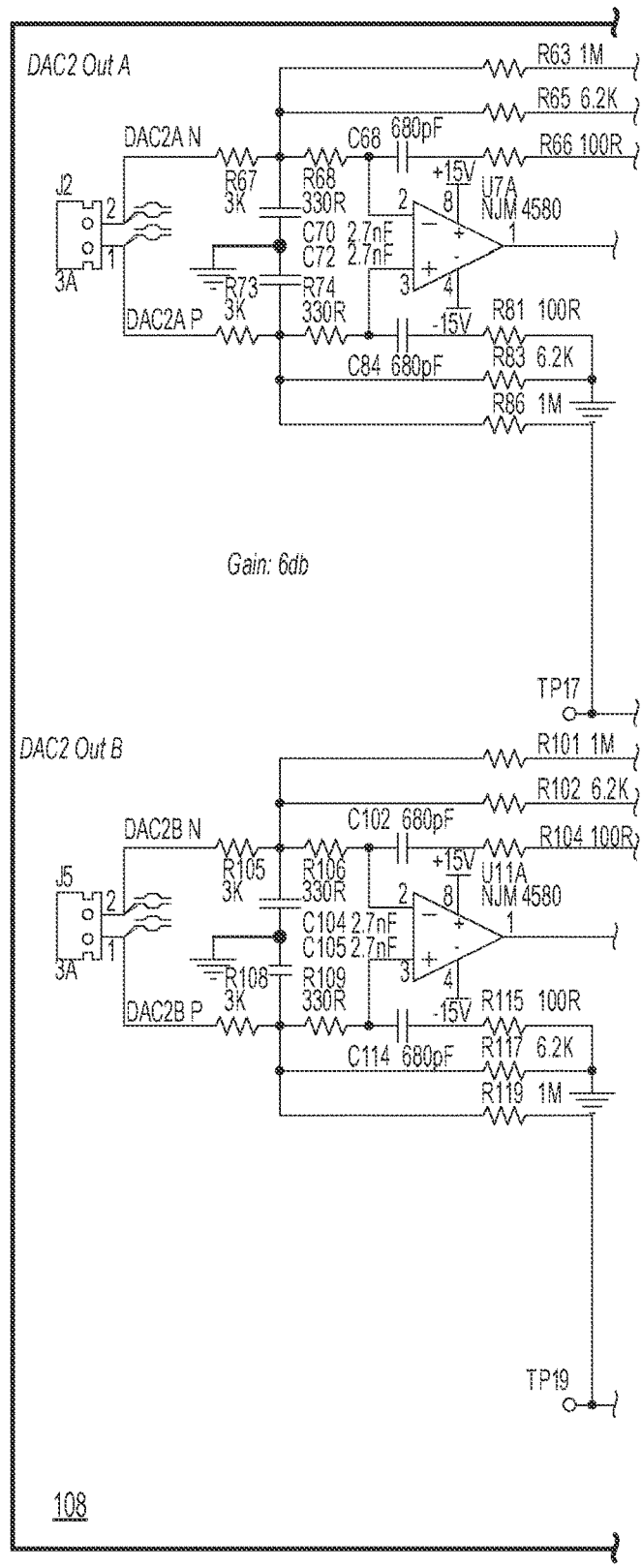
Figure 1:
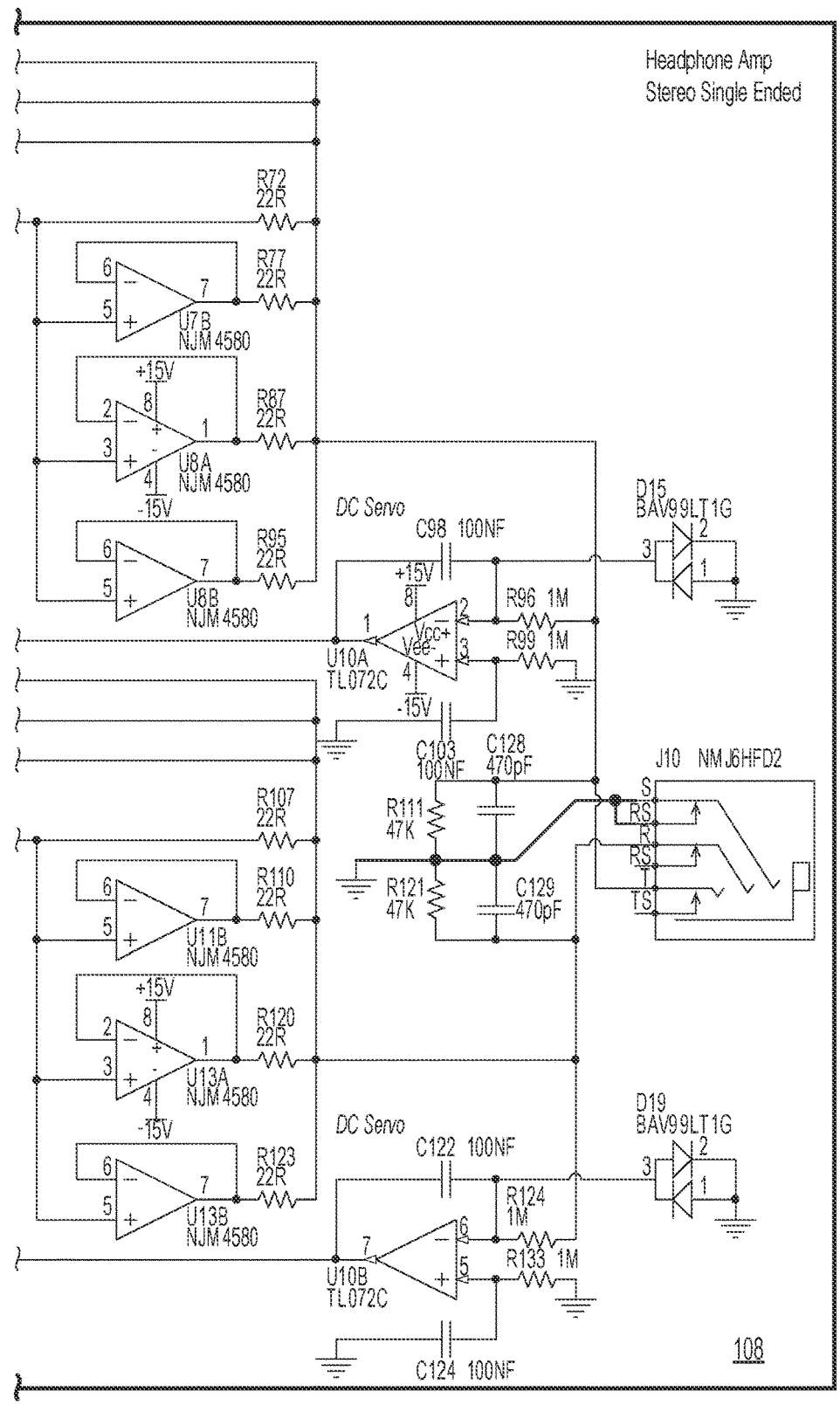

Referring to FIG. 1, a pre-amplifier circuit 100 is illustrated according to a non-limiting embodiment. The pre-amplifier circuit 100 includes a microphone pre-amplifier stage 102 (i.e., circuit), a PSU 104, a digital-to-analog converter stage 106, and a headphone amplifier stage 108.

The microphone pre-amplifier stage 102 includes a direct injection (DI) unit that provides a high impedance source signal and a low impedance XLR connection operable without a line or mic switch. An XLR connection is referred to as a balanced audio interconnection, including AES3 for digital audio applications. The DI unit may connect a high-impedance source signal (e.g. high-impedance, line level, unbalanced source signal) to a low-impedance, microphone level, balanced input. The XLR connection may include an XLR electrical connector that connects the high-impedance source signal to the low-impedance, microphone input to provide a balanced audio interconnection.

According to a non-limiting embodiment, the DI unit may provide electrical ground isolation between input and output, and they match the impedance of the source signal to that of a load. For example, a DI unit may be implemented with a high input impedance and a low output impedance may be used to match an input device (e.g., guitar, bass, etc.) to the input stage of a second device (e.g., mixing device). In at least one embodiment, the DI unit is an active electrical DI unit that receives phantom power output generated by the PSU 104.

The pre-amplifier circuit 100 further includes self-biasing input component (e.g., transistor pairs) that bias input to an analog-to-digital converter (ADC). The self-biasing input components may be implemented as junction gate field effect transistor (JFET) pairs or operation amplifier pairs. In this manner, a low cost, high current DC coupled headphone output is provided.

Figure 2:
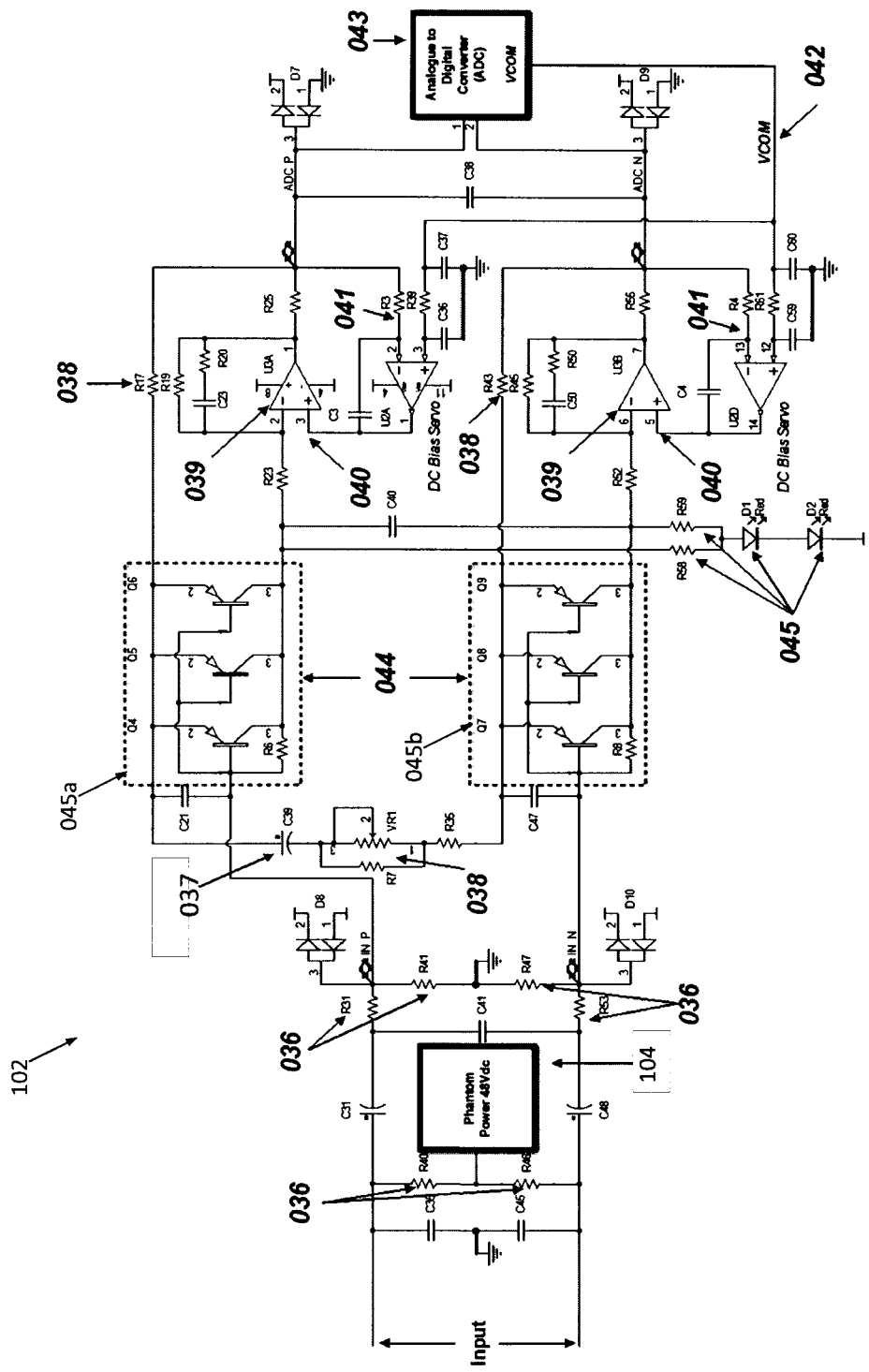
FIG. 2 is a schematic diagram of a microphone pre-amplifier stage according to a non-limiting embodiment.

Turning now to FIG. 2, the microphone pre-amplifier stage (i.e., circuit) 102 will be described in further detail. The microphone pre-amplifier stage 102 includes a phantom power supply 104 and an analog-to-digital converter (ADC) 043. The phantom power supply is capable of delivering DC power through microphone cables and can operate microphones that contain active electronic circuitry. In one example, the phantom power supply 104 can generate 48 volt phantom power to drive one or more condenser microphones connected to the microphone pre-amplifier stage 102. An input transistor pair circuit 044 includes a first transistor network 045a and a second transistor network 045b which regulate the phantom power input to the microphone pre-amplifier stage 102. In at least one embodiment, the microphone pre-amplifier stage 102 operates as a self-biasing differential microphone/Line (MIC/Line) pre-amplifier. Accordingly, the microphone pre-amplifier stage 102 is capable of biasing the pair of transistor networks 045a and 045b.

Still referring to FIG. 2, the ADC 043 is configured to convert analog signals from the microphone pre-amplifier stage 102 into digital data (i.e., digital signals). In this manner, a Digital Signal Processor (DSP) can be implemented with the microphone pre-amplifier stage 102 to manipulate or perform digital signal processing on the source-signal.

The common voltage (VCOM) of the ADC 043 is fed to a DC bias servo integrator circuit 041, while the output of the DC bias servo integrator circuit is fed to the non-inverting inputs 040 of an operational amplifier included in the respective differential microphone amplifier circuits 039. The reference for the DC bias servo is set by the ADC 043. The DC Bias servo 041 actively monitors the outputs of a pair of differential microphone amplifier circuits 039 including a first operation amplifier (OpAmp) U3A and a second OpAmp U3B. That is, the VCOM voltage serves as a reference voltage, and allows the bias DC servo circuit 041 to actively bias 044 input transistor pair 044 of a differential microphone amplifier circuit 039.

In this manner, the DC Bias servo 041 ensures that the output is set at a fixed voltage equal to the VCOM indicated by VCOM signal 042, regardless as to the DC level that may exist at other locations inside circuit. In addition, the differential microphone amplifier circuits 039 achieve a differential input-differential output, while conventional hybrid designs convert differential balanced inputs to single ended output.

In tandem with biasing the outputs of the microphone amplifier circuits 039 (i.e., the first OpAmp U3A and the second OpAmp U3B) the DC bias servo 041 also provides sufficient bias voltage to the input transistor pair circuit 044. This bias voltage maintains the transistors 045a and 045b in "turn on" state. Accordingly, the bias level can be increased to effectively operate the input-stage in the so-called class-A region. Cass-A operation implies that the transistors 045a and 045b are in constant conducting state. A current sourcing circuit 045 including resistor R58, resistor R59, diode D1 and diode D2 sets the base current through the input transistor pair circuit 044. The current through the input transistor pair circuit 044 can be set by the selected values of resistor R58 and resistor R59.

In at least one embodiment diode D1 and diode D2 are light emitting diodes (LED's), and are configured to reduce the negative power supply voltage. In one example, the negative power supply can be reduced by approximately 3 Vdc. In this manner, inputs of U3A and U3B are clamped to the op-amps voltage rail to avoid saturation.

According to at least one non-limiting embodiment, the input transistor pair circuit 044 is incorporated inside the feedback loop defined by the 039. In this manner, total harmonic distortion (THD+N) and transistor non-linearity of the input transistor pair circuit 044 is reduced, while also significantly reducing distortion and noise. Accordingly, the 102 can interface directly with the ADC 043, as opposed to requiring an additional ADC biasing circuit to achieve the biased input voltage to the ADC 043.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A microphone pre-amplifier circuit comprising:
   a phantom power supply configured to generate input power;
   a pair of input transistor circuits configured to generate a regulated input voltage based on the input power;
   a pair of differential microphone amplifier circuits configured to amplify the regulated input voltage, and output the amplified voltage to an analog-to-digital converter (ADC); and
   a direct current (DC) bias servo circuit in signal communication with the pair of differential microphone amplifier circuits and the ADC, the DC bias servo circuit configured to control the pair of differential microphone amplifier circuits based on an internal common voltage (VCOM) of the ADC,
   wherein the DC bias servo circuit determines a reference voltage based on the VCOM, and actively controls the pair of differential microphone amplifier circuits based on a comparison between output voltages of the pair of differential microphone amplifier circuits and the reference voltage.

2. The microphone pre-amplifier circuit of claim 1, wherein the DC bias servo circuit actively controls the pair of differential microphone amplifier circuits such that the output voltages are set at a fixed voltage equal to the VCOM.

3. The microphone pre-amplifier circuit of claim 1, wherein each differential microphone amplifier circuit includes an operational amplifier and a feedback circuit path including a first node in signal communication with the ADC and a second node connected to an input of the operational amplifier.

4. The microphone pre-amplifier circuit of claim 3, wherein a first input transistor circuit among the pair of input transistor circuits is electrically nested in a first feedback path of a first differential microphone amplifier circuit, and wherein a second input transistor circuit among the pair of input transistor circuits is electrically nested in a second feedback path of a second differential microphone amplifier circuit.

5. The microphone pre-amplifier circuit of claim 1, wherein the DC bias servo circuit generates a bias voltage that biases the pair of differential microphone amplifier circuits in an on-state for outputting the amplified voltage.

6. A method of operating a microphone pre-amplifier circuit, the method comprising:
   generating an input power via a phantom power supply;
   generating, via a pair of input transistor circuits, a regulated input voltage based on the input power;
   amplify the regulated input voltage, via a pair of differential microphone amplifier circuits, and outputting the amplified voltage to an analog-to-digital converter (ADC); and
   controlling, via a direct current (DC) bias servo circuit, the pair of differential microphone amplifier circuits based on an internal common voltage (VCOM) of the ADC, wherein controlling the pair of differential microphone amplifier circuits comprises:
   determining a reference voltage based on the VCOM, and actively controlling the pair of differential microphone amplifier circuits based on a comparison between output voltages of the pair of differential microphone amplifier circuits and the reference voltage.

7. The method of claim 6, further comprising actively controlling the pair of differential microphone amplifier circuits such that the output voltages are set at a fixed voltage equal to the VCOM.

8. The method of claim 6, wherein each differential microphone amplifier circuit includes an operational amplifier and a feedback circuit path including a first node in signal communication with the ADC and a second node connected to an input of the operational amplifier.

9. The method of claim 8, wherein a first input transistor circuit among the pair of input transistor circuits is electrically nested in a first feedback path of a first differential microphone amplifier circuit, and wherein a second input transistor circuit among the pair of input transistor circuits is electrically nested in a second feedback path of a second differential microphone amplifier circuit.

10. The method of claim 6, further comprising biasing the pair of differential microphone amplifier circuits in an on-state for outputting the amplified voltage based on a bias voltage generated by the DC bias servo circuit.

* * * * *